(12) United States Patent
Lu

(10) Patent No.: US 7,423,348 B2
(45) Date of Patent: Sep. 9, 2008

(54) CHIP STRUCTURE AND CHIP PACKAGE STRUCTURE

(75) Inventor: Su-Tsai Lu, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/306,160

(22) Filed: Dec. 19, 2005

(65) Prior Publication Data

US 2007/0052110 A1 Mar. 8, 2007

(30) Foreign Application Priority Data

Sep. 7, 2005 (TW) .............................. 94130638 A

(51) Int. Cl.
*H01L 23/48* (2006.01)
*H01L 23/52* (2006.01)
*H01L 29/40* (2006.01)

(52) U.S. Cl. ....................................... 257/783; 257/781
(58) Field of Classification Search ................. 257/783, 257/780, 781, 778, 782
See application file for complete search history.

(56) References Cited

U.S. PATENT DOCUMENTS

| | | | | |
|---|---|---|---|---|
| 5,508,228 A | | 4/1996 | Nolan et al. ................. | 438/614 |
| 5,744,320 A | * | 4/1998 | Sherf et al. .................... | 435/8 |
| 5,783,465 A | | 7/1998 | Canning et al. ............. | 438/119 |
| 5,844,314 A | | 12/1998 | Kim ........................... | 257/737 |
| 5,844,317 A | * | 12/1998 | Bertolet et al. .............. | 257/773 |
| 6,528,889 B1 | * | 3/2003 | Matsuhira et al. ........... | 257/778 |
| 2001/0042918 A1 | * | 11/2001 | Yanagida .................... | 257/753 |
| 2003/0080420 A1 | * | 5/2003 | Ohara ......................... | 257/737 |
| 2003/0222352 A1 | * | 12/2003 | Kung et al. .................. | 257/772 |
| 2005/0242436 A1 | * | 11/2005 | Abe et al. .................... | 257/737 |
| 2005/0242446 A1 | * | 11/2005 | Jin .............................. | 257/779 |

FOREIGN PATENT DOCUMENTS

CN 1683960 10/2005

* cited by examiner

*Primary Examiner*—S. V Clark
(74) *Attorney, Agent, or Firm*—Jianq Chyun IP Office

(57) ABSTRACT

A chip structure including a chip, a passivation layer, an elastic layer and a metal layer is provided, with a bump disposed on the metal layer for electrically connecting a bonding pad of the chip. The passivation layer and the elastic layer are covering an active surface of the chip, and have an opening respectively for exposing top surface of the bonding pad, wherein the elastic layer is utilized to make the bump being heat-pressed onto a contact of a substrate with an enhanced electrical performance, and the elastic layer is made of for example polyimide or other macromolecule polymer. Moreover, the chip structure further includes a plurality of elastic granular structures at the bottom of the bump to enhance the bonding reliability of the bump.

18 Claims, 15 Drawing Sheets

CHIP STRUCTURE AND CHIP PACKAGE STRUCTURE

CROSS-REFERENCE TO RELATED APPLICATION

This application claims the priority benefit of Taiwan application serial no. 94130638, filed on Sep. 7, 2005. All disclosure of the Taiwan application is incorporated herein by reference.

BACKGROUND OF THE INVENTION

1. Field of Invention

The present invention relates to a semiconductor fabrication process and structure thereof, and particularly to a chip package process and structure thereof.

2. Description of Related Art

In chip packaging techniques, Tape Carrier Package (TCP) is a major method for packaging liquid crystal display (LCD) driver chip (IC) in recent years. However, when bonding chips with relatively thin inner pins, both the fabrications of the tape and the subsequent chip bonding process will become very difficult due to the limitation of the tape material and its structural property. Therefore, Chip on Film (COF) and Chip on Glass (COG) are developed under the demand for thin, light and compact package in future. The current package method of COF employs vertical conduction bonding by the Anisotropic Conductive Film (ACF), eutectic bonding by heat-pressing the bump and shrinkage bonding by heat-pressing and curing the Non-Conductive Polymer (NCP/NCF).

Referring to FIG. 1, a schematic view of a conventional package structure using vertical conduction bonding by the ACF is depicted. The ACF 100 is mainly used to provide an electrical conduction between a gold bump 110 and a contact 120 in the vertical direction by utilizing the conductive effect produced by the deformation of the conductive particle 102 after being pressed. The resin 104 is insulating in horizontal direction. There must be a sufficient amount of conductive particles 102 pressed between the gold bump 110 and the contact 120 to obtain a low contact resistance. At present, the conductive particles 102 may have a particle size as small as 3-5 µm, and are distributed in the resin 104 dispersedly. Thus, it is very possible for the conductive particles 102 in high density to aggregate in the area between the gold bumps 110 and causes a bridge short. Or, the non-uniform distribution of the conductive particles 102 causes an open circuit or different contact resistances. Therefore, the distribution uniformity and density of the conductive particles 102 will influence the electrical performance after the gold bump 110 being bonded with the contact 120.

Next, referring to FIG. 2, a schematic view of a conventional package structure using eutectic bonding is depicted. Eutectic bonding is mainly to bond the gold bump 110 and tin block 122 together by eutectic through applying heat and pressure uniformly. Since the eutectic bonding has high strength and high reliability, and will not cause the problem of bridge short, it therefore can be applied in the package structure with fine contact pitch.

And then, referring to FIG. 3, a schematic view of a conventional package structure using shrinkage bonding by the NCP/NCF is depicted. The shrink force produced by heat-pressing and curing the NCP/NCF 130 maintains a certain contact stress between the gold bump 110 and the contact 120 in conduction; while the thermal expansion of the NCP/NCF 130 in the high-temperature environment may obviously reduce the contact stress between the gold bump 110 and the contact 120, and the contact resistance is thereby increased. Therefore, the thermal expansion and cold shrinkage property of the NCP/NCF 130 will directly influence the electrical performance after the gold bump 110 being bonded with the contact 120.

In view of this, it is an essential issue to enhance the bonding reliability between the gold bump and the contact, based upon the existing chip package techniques, so as to avoid the problems. The problems may influence the electrical performance after the gold bump being bonded with the contact due to, for example, bridge short or thermal expansion and cold shrinkage of the resin.

SUMMARY OF THE INVENTION

The present invention provides a chip structure and bumping process thereof, in which an elastic layer and/or elastic granular structures for stress buffering are provided at the bottom of the bump to enhance the bonding reliability of the bumps.

The present invention provides a chip package structure and process thereof, in which an elastic layer and/or elastic granular structures for stress buffering are provided in the bottom of the bump to enhance the electrical performance and reliability after the bump being bonded to the contact.

The present invention provides a chip structure comprising a chip, a passivation layer, an elastic layer and a metal layer. The chip has an active surface and at least one bonding pad disposed on the active surface. The passivation layer covers on the active surface and has at least one first opening for exposing a surface of the bonding pad correspondingly. Further, the elastic layer is covering on the passivation layer, and has at least one second opening for exposing the first opening correspondingly. Additionally, the metal layer is covering at least on the surface of the bonding pad and part of the elastic layer.

According to an embodiment of the present invention, the elastic layer is made of macromolecule polymer, for example, and the metal layer can be further connected to a gold bump or a solder bump correspondingly, with the top of the gold bump or the solder bump protruding out from the second opening. The material of the metal layer is selected from, for example, gold, titanium, tungsten, chromium, copper or alloy thereof.

According to an embodiment of the present invention, the chip structure further comprises at least one stopper disposed around the second opening of the elastic layer. Moreover, the chip structure further comprises a plurality of elastic granular structures protruding out at periphery of the second opening of the elastic layer and further covered by the metal layer. The elastic granular structures are disposed, for example, between the second opening of the elastic layer and the stopper.

The present invention proposes a bumping process comprising the following steps of: providing a wafer firstly, wherein the wafer includes a plurality of chips and a passivation layer, and each chip has at least one bonding pad exposed in a first opening of the passivation layer; forming an elastic layer on the passivation layer, which has at least a second opening for exposing the first opening correspondingly; forming a metal layer in the first opening and the second opening, wherein the metal layer at least covers the bonding pad and a part of the elastic layer. Then, a bump is formed on the metal layer. Moreover, the step of forming the elastic layer can further comprise forming at least one stopper at a periphery of the second opening of the elastic layer.

The present invention proposes a chip package structure comprising a substrate, a chip, a metal layer, at least one bump and a resin. The substrate has at least one contact, and the chip is disposed on the substrate and has at least one bonding pad and an elastic layer. The elastic layer has an opening for exposing a surface of the bonding pad. Furthermore, the metal layer at least covers the surface of the bonding pad and a part of the elastic layer. The bump is disposed on the metal layer and heat-pressed onto the contact. Additionally, the bump is deformed by the resin. The resin is, for example, an ACF, which has a plurality of conductive particles electrically connected between the bump and the contact. The elastic layer is made of for example macromolecule polymeric materials, and the metal layer is made of a material selected from, for example, gold, titanium, tungsten, chromium, copper or alloy thereof.

According to an embodiment of the present invention, the chip package structure further comprises at least one stopper disposed at periphery of the opening of the elastic layer. Moreover, the chip package structure can further comprise a plurality of elastic granular structures protruding out at periphery of the opening of the elastic layer and further covered by the metal layer. The elastic granular structures are disposed, for example, between the opening of the elastic layer and the stopper.

According to an embodiment of the present invention, the chip package structure further comprises at least one stopper disposed at the outer periphery of the opening of the passivation layer and these elastic granular structures.

The present invention employs the chip structure having an elastic layer and/or elastic granular structures and bumping process thereof, such that the electrical performance after the bump being heat-pressed onto the contact can be improved by the stress-buffering effect of the elastic layer and/or the elastic granular structures. It then maintains a preferable contact stress and enhances the bonding reliability of the bump.

BRIEF DESCRIPTION OF THE DRAWINGS

The above objects and other objects, features or advantages of the present invention will become apparent from the preferred embodiments given hereinafter in conjunction with the accompanying figures.

DESCRIPTION OF THE PREFERRED EMBODIMENTS

Figure 1:
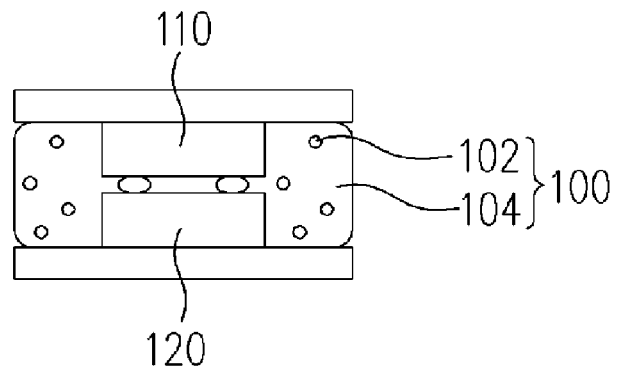
FIG. 1 depicts a schematic view of a conventional package structure using vertical conduction bonding produced by the ACF.
Figure 2:
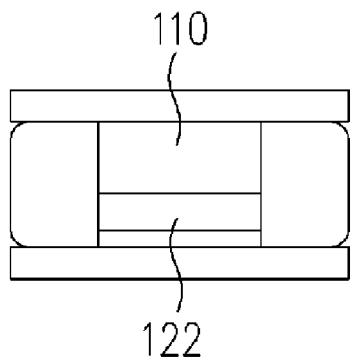
FIG. 2 depicts a schematic view of a conventional package structure using eutectic bonding.
Figure 3:
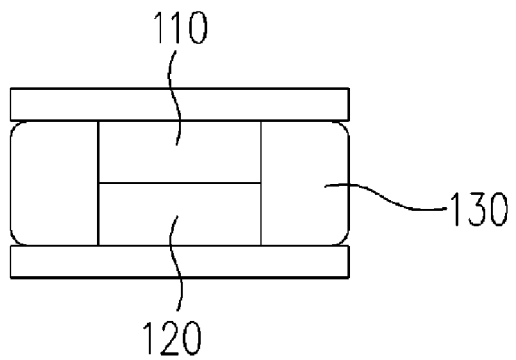
FIG. 3 depicts a schematic view of a conventional package structure using shrinking bonding produced by the NCP/NCF.
Figure 4:
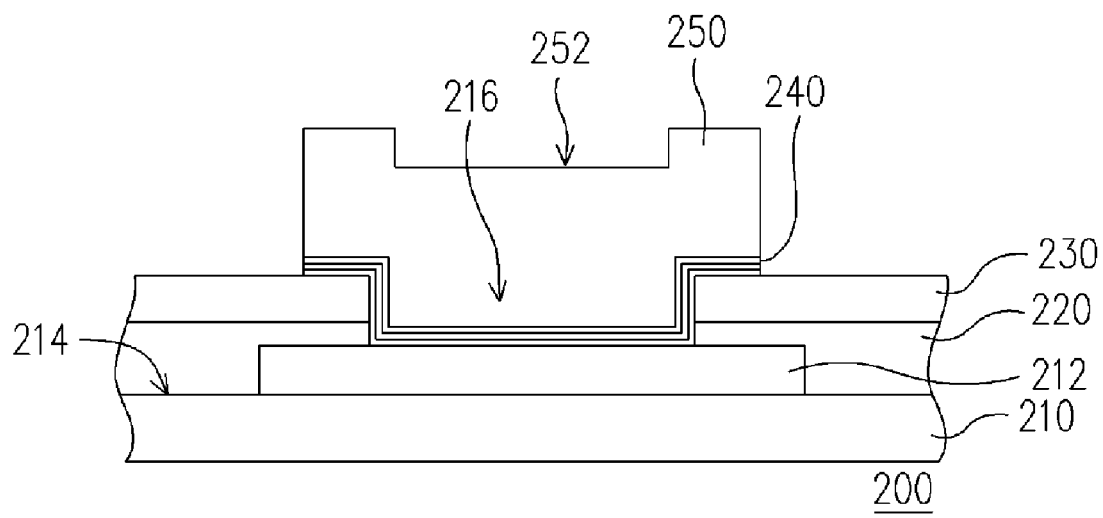
FIGS. 4 and 5 depict the sectional schematic views of a bump structure having an elastic layer, according to a first embodiment of the present invention.
Figure 5:
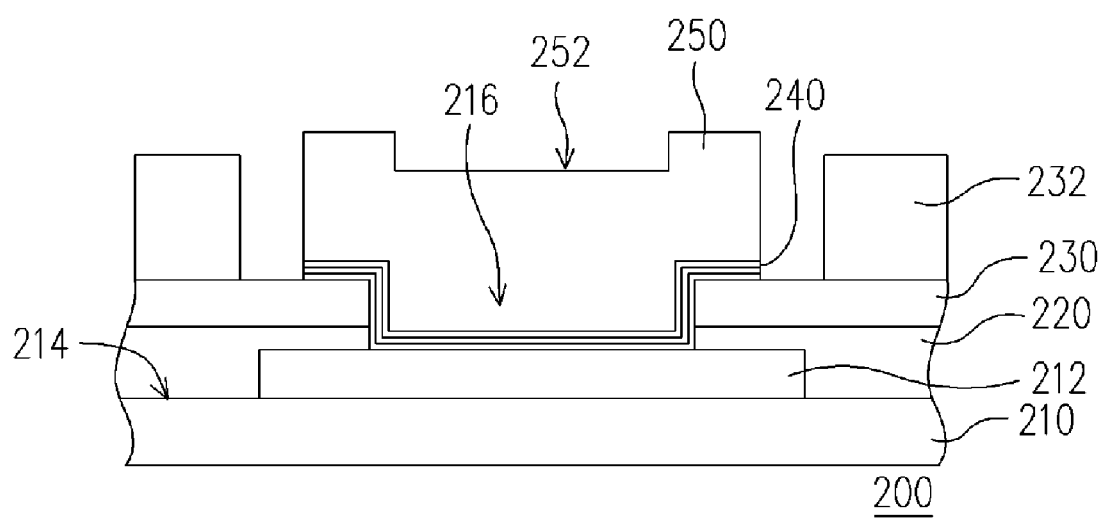

Referring to FIGS. 4 and 5, cross-sectional schematic views of a bump structure having an elastic layer in a first embodiment of the present invention is depicted. The chip structure 200 in FIG. 4 mainly comprises a chip 210, a passivation layer 220, an elastic layer 230 and a metal layer 240, with the bump 250 further disposed on the metal layer 240 for electrically connecting to a bonding pad 212 of the chip 210. The chip 210 has an active surface 214. The passivation layer 220 and the elastic layer 230 respectively cover the active surface 214 of the chip 210, and respectively have an opening 216 for exposing a top surface of the bonding pad 212. Furthermore, the metal layer 240 can cover the inner wall of the opening 216 and the top surface of the elastic layer 230 in step coverage, in addition to covering the top surface of the bonding pad 212. In the present embodiment, the metal layer 240 can be made of a material selected from the group consisting of gold, titanium, tungsten, chromium, copper and alloy thereof, and the bonding pad 212 is made of for example, copper or aluminum. The metal layer 240 can enhance the bonding strength between the bonding pad 212 and the bump 250, so as to resist the destruction resulting from the thermal stress.

As described above, in the application of the bump, such as gold bump, the elastic layer 230 can enhance the electrical performance after the gold bump 250 being heat-pressed to the contact (not shown) of the substrate, and the elastic layer 230 is made of for example polyimide or other macromolecule polymers. The application of the elastic layer 230 in chip package techniques will be described in details in the subsequent processes. Furthermore, the height of the gold bump 250 can be controlled within the range of 10-15 µm. A recess 252 with the same size as the opening 216 can be formed on the top of the gold bump 250, and the peripheral surface of the recess 252 protrudes relatively, such that the gold bump 250 can be bonded with the contact of the substrate because of the deformation after being heat-pressed, thus enhancing the bonding reliability.

Further, referring to FIG. 5, one or more stoppers 232 can be disposed on the top surface of the elastic layer 230, near the periphery of the bump 250, so as to prevent the bridging conduction between the two adjacent gold bumps 250 by the ACF conductive particles (not shown). The application of the stoppers in the chip package technique will be described in details in the subsequent processes.

Figure 6:
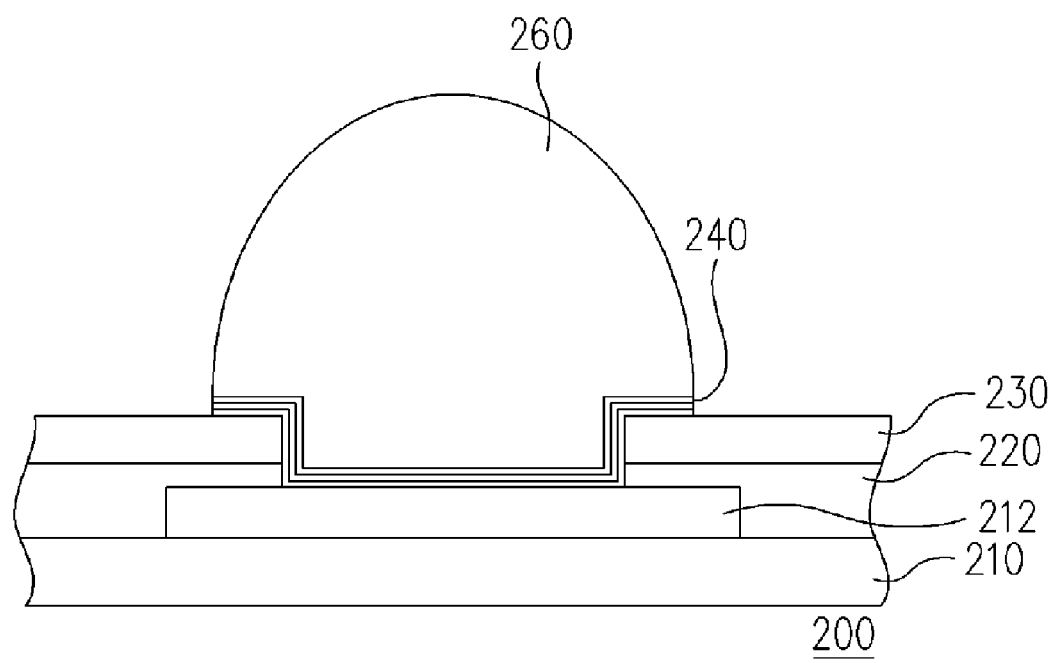
FIGS. 6 and 7 depict the sectional schematic views of a bump structure having an elastic layer, according to another embodiment of the present invention.
Figure 7:
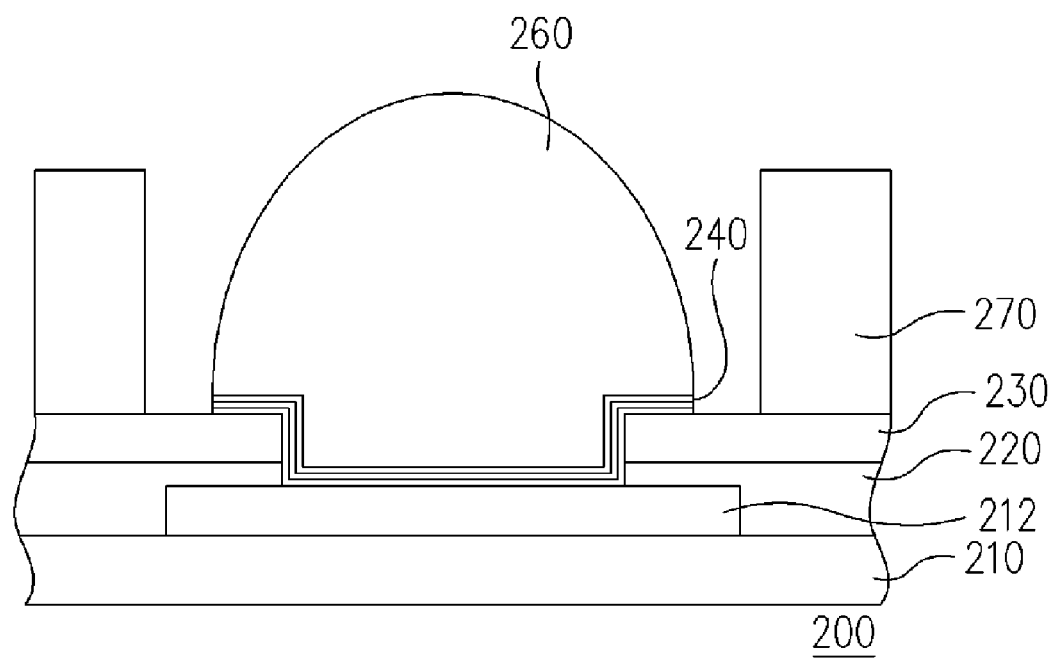

The above elastic layer 230 and stopper 232 can be applied in the solder bump simultaneously or separately, as shown in FIGS. 6 and 7. The chip structure 200 in FIG. 6 mainly comprises a chip 210, a passivation layer 220, an elastic layer 230 and a metal layer 240, with a solder bump 260 disposed on the metal layer 240 for electrically connecting to a bonding pad 212 of the chip 210. The solder bump 260 is made of for example, tin-lead alloy or lead free solder. Since the solder bump 260 has a low melting point, it can be soldered on the contact (not shown) of the substrate by high-temperature solder reflow. The elastic layer 230 is made of for example, polyimide or other macromolecule polymers. The elastic layer 230 can elastically buffer the destruction to the chip 210 due to the thermal stress, to enhance the bonding reliability. Moreover, the chip structure 200 in FIG. 7 further comprises one or more stoppers 270, disposed on the top surface of the elastic layer 230, near the periphery of the solder bump 260, for increasing the resistance of the chip 210 against the thermal stress.

Figure 8:
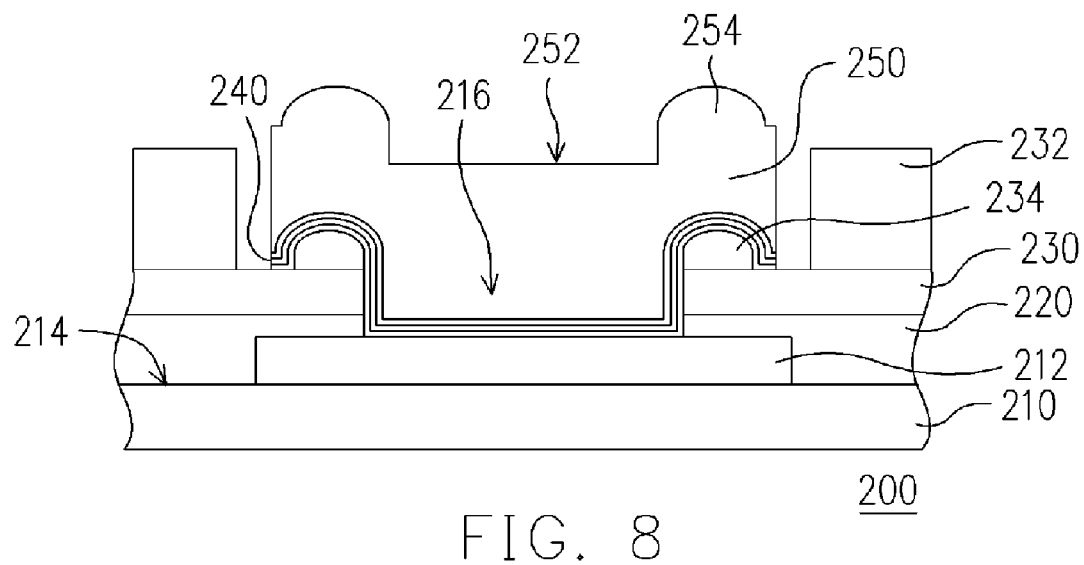
FIG. 8 depicts a cross-sectional schematic view of a bump structure having elastic granular structures, according to an embodiment of the present invention.

Referring to FIG. 8, a cross-sectional schematic view of a bump structure having elastic granular structures in an embodiment of the present invention is depicted. In the present embodiment, the like numerals are used to indicate the like elements. The arrangement of the chip 210, the passivation layer 220, the elastic layer 230 and the metal layer 240 is referred to the descriptions of FIG. 5, and will not be described in further details. Unlike the first embodiment, a plurality of elastic granular structures 234 are further formed at the bottom of the bump 250 and distributed at the periphery of the opening of the elastic layer 230. A material for the elastic granular structures can be, for example, the same material as the elastic layer 230, so that the electrical performance after the bump 250 being heat-pressed to the contact of the substrate (not shown) will be further enhanced. The elastic granular structures 234 are covered by the metal layer 240, and a protruding surface 254 having the same shape as that of the elastic granular structures 234 is formed on the top of the bump 250 corresponding to the buffer granular structures 234. Since the shape of the top of the bump 250 is changed, the deformation after the bump 250 being heat-pressed to the contact of the substrate can be increased, thereby enhancing the bonding reliability.

Figure 9:
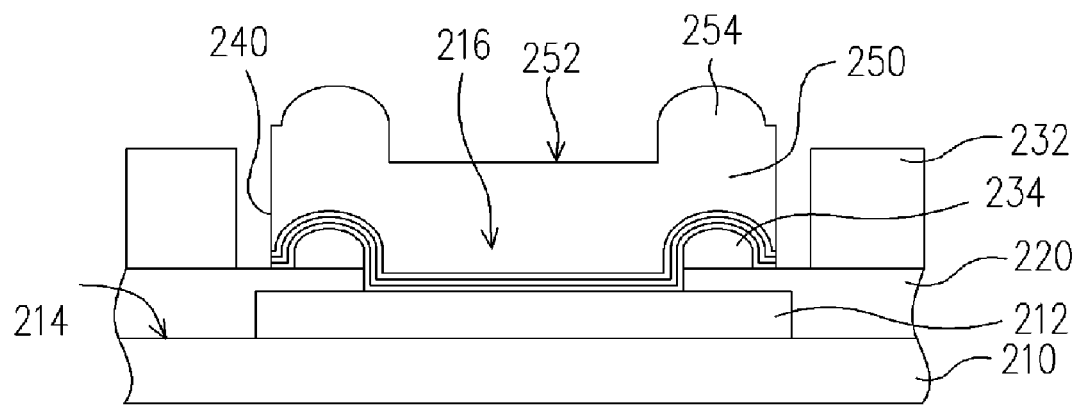
FIG. 9 depicts a cross-sectional schematic view of a bump structure having elastic granular structures, according to another embodiment of the present invention.

Further, referring to the chip structure of FIG. 9, a plurality of buffer granular structures 234 are also provided at the bottom of the bump 250, but the elastic granular structures 234 are directly disposed at the periphery of the opening 216 of the passivation layer 220, but not at the periphery of the opening of the elastic layer 230 as shown in FIG. 8. Similarly, the shape of the top of the bump 250 changes along with the elastic granular structures 234, such that the deformation after the bump 250 being heat-pressed to the contact of the substrate is increased, thereby enhancing the bonding reliability.

Figure 10:
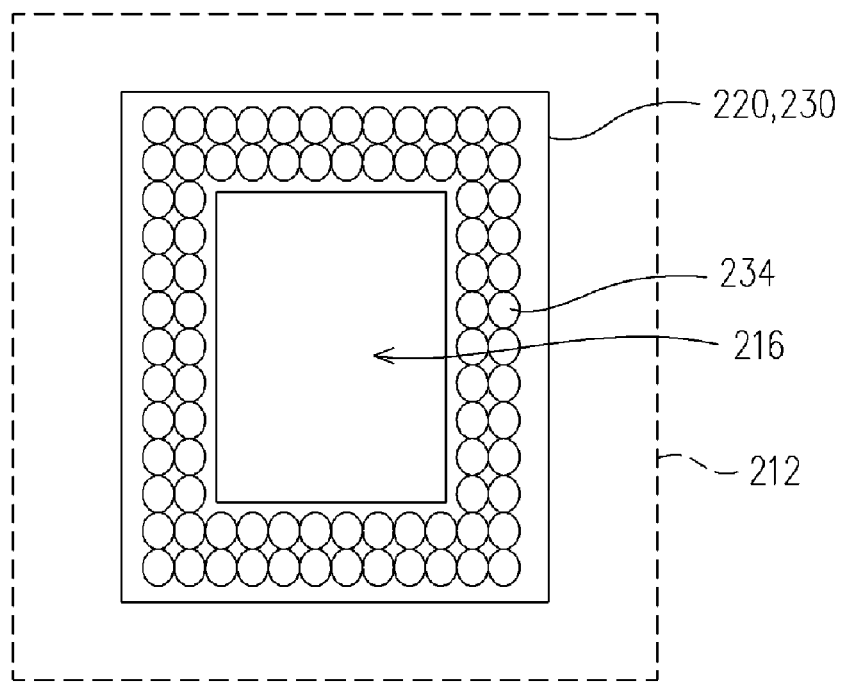
FIGS. 10 and 11 depict the schematic top views of the elastic granular structures disposed around the opening respectively.
Figure 11:
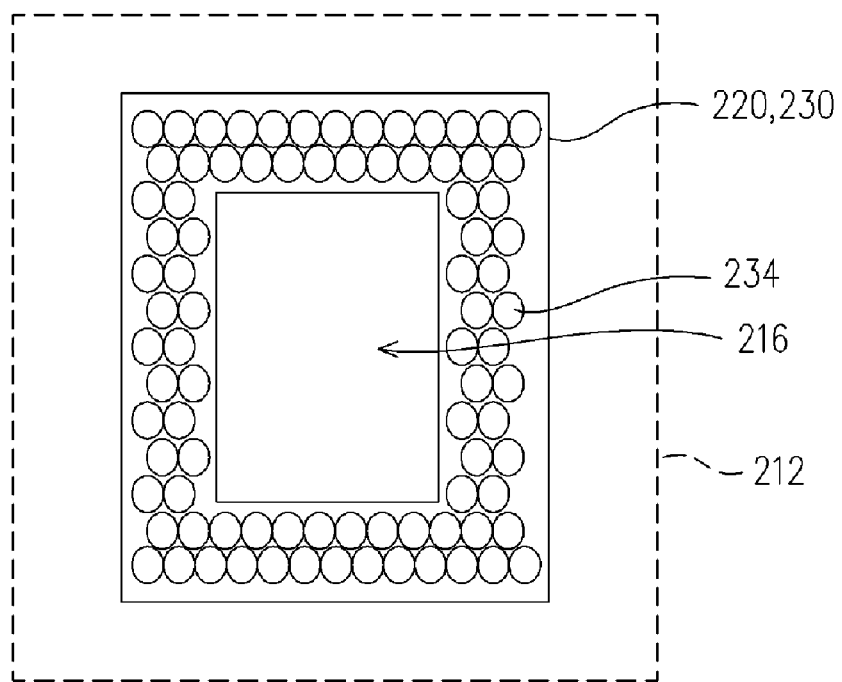

Referring to FIGS. 10 and 11, schematic top views of the elastic granular structures disposed at periphery of the opening is depicted respectively. A nano-microstructure may be formed on the top surface of the passivation layer 220 or the elastic layer 230 described above by nano-scale exposure and development techniques and is distributed around the opening 216. These nano-microstructures distributed as dots and arranged regularly are the above-mentioned elastic granular structures 234, as shown in FIG. 10. Furthermore, the nano-microstructures (i.e. the elastic granular structures 234) shown in FIG. 11 are distributed at the periphery of the opening 216 in an alternative manner. Of course, other implementations or arrangements also can be applied to the fabrication of the elastic granular structures 234, and the scope protected by the present invention should not be limited by different fabrications.

Referring to FIGS. 12A-12I, schematic flow charts of a bumping process having an elastic layer in an embodiment of the present invention is depicted respectively. First, referring to FIG. 12A, a wafer 300 having a plurality of chips 310 and a passivation layer 320 is provided, and each chip 310 has at least one bonding pad 312 exposed in a first opening 322 of the passivation layer 320. Next, referring to FIG. 12B, an elastic layer 330 is formed on the passivation layer 320, and has at least a second opening 332 exposing the first opening 322 correspondingly. And then, referring to FIG. 12C, a metal layer 340 is sputtered or evaporated. The metal layer 340 can cover the top surface of the bonding pad 312. In addition, the metal layer 340 can further outwardly cover the top surface of the elastic layer 330.

After then, referring to the process of plating the gold bump in FIGS. 12D-12G, a photoresist 342 is spin-coated on the elastic layer 330 first, and then exposed and developed to from a proper opening 344 for exposing the metal layer 340 above the bonding pad 312. Then, a plating is carried out by taking the metal layer 340 as a seed layer for plating, such that a gold bump 350 is grown in the photoresist opening 344. The photoresist 342 is removed with a solvent, and a gold bump 350 is thereby obtained. Furthermore, in FIG. 12H, a part of the metal layer 340 on the surface of the elastic layer 330 is removed using etching agent, and only the metal layer 340a in the bottom of the bump 350 is reserved. Although the plating is used to form the gold bump 350 or other solder bumps in the present embodiment, other techniques for fabricating bumps can also be used without limitation to it.

Figure 12A:
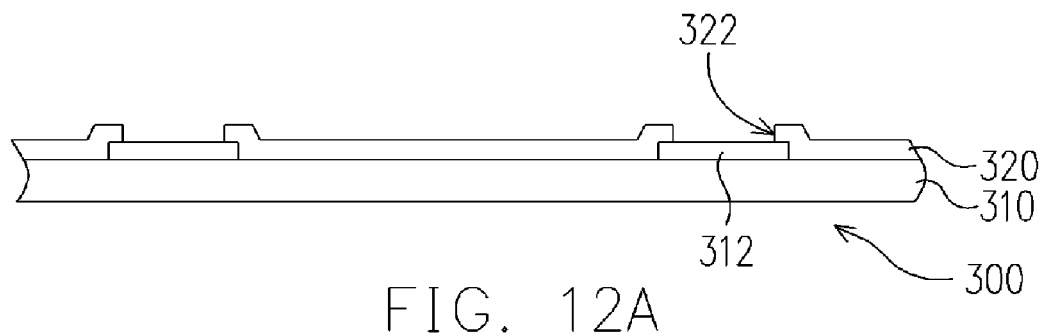
FIGS. 12A-12I depict a schematic flow chart of a bumping process having an elastic layer, according to an embodiment of the present invention respectively.
Figure 12B:
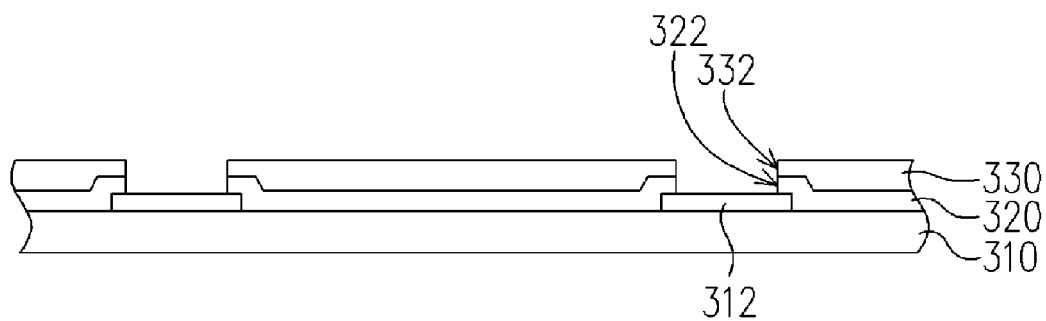
Figure 12C:
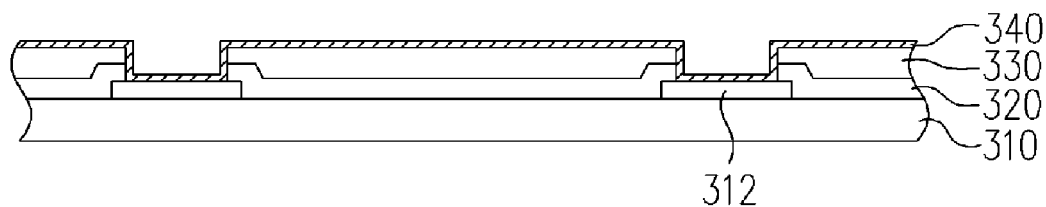
Figure 12D:
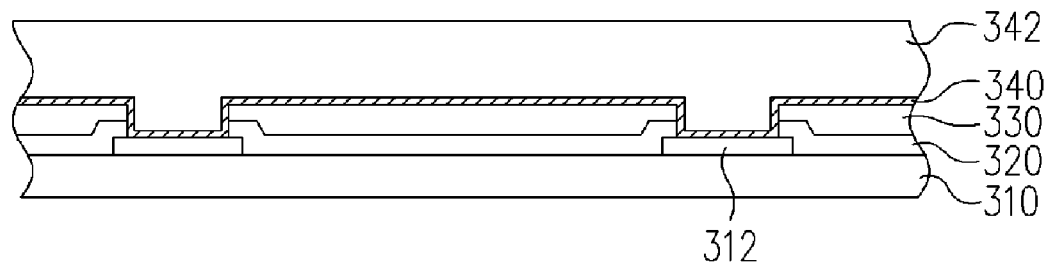
Figure 12E:
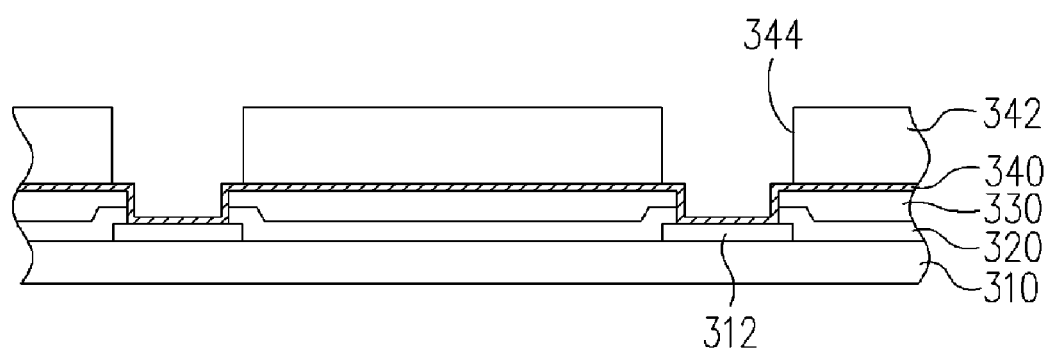
Figure 12F:
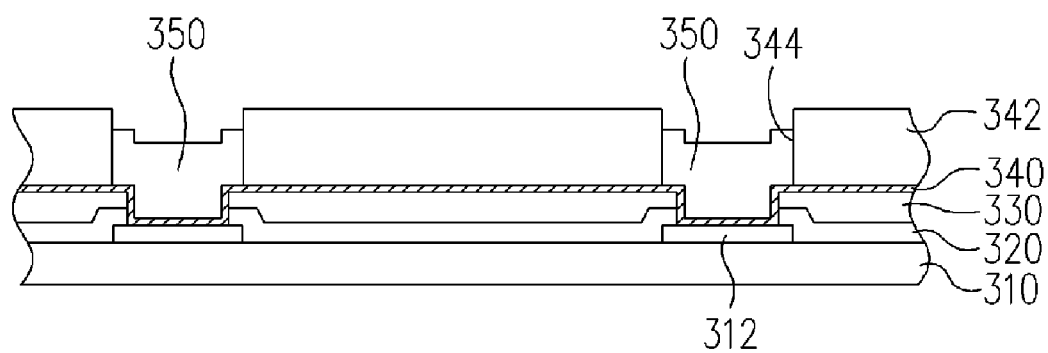
Figure 12G:
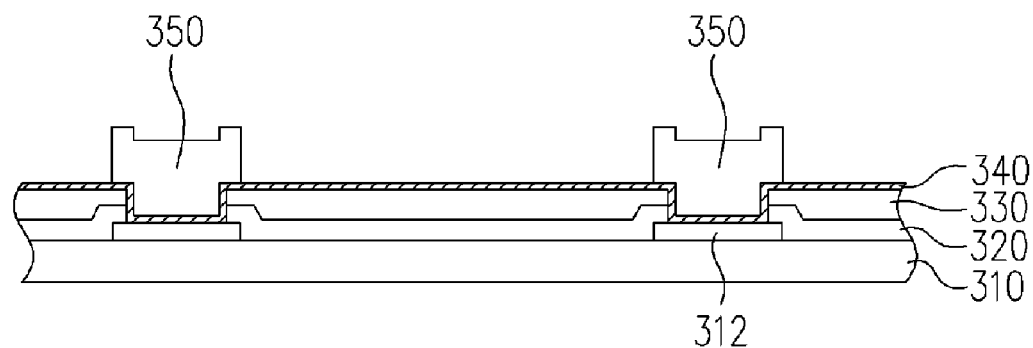
Figure 12H:
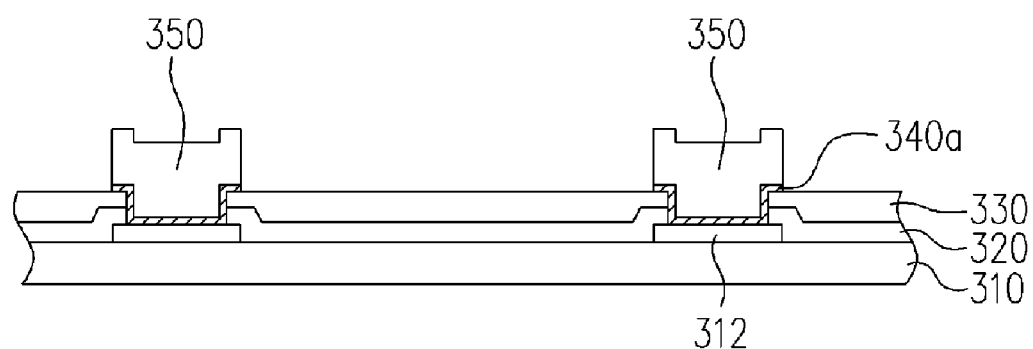
Figure 12I:
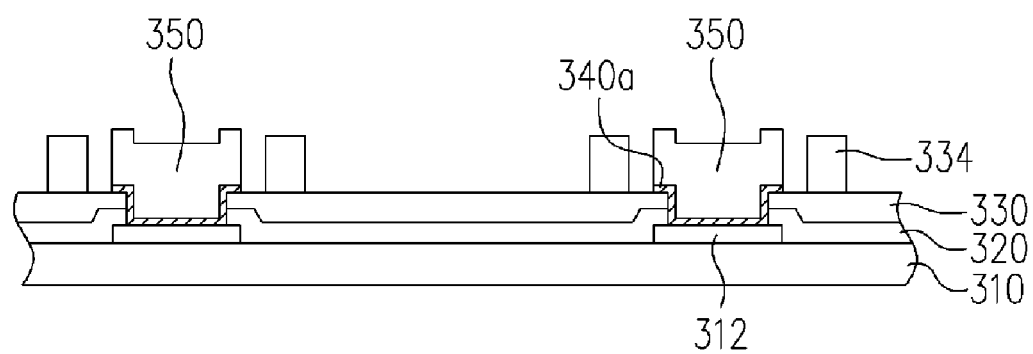

Finally, referring to FIG. 12I, at least one stopper 334 can be further disposed around the bump 350, and the shape and arrangement of the stopper 334 can be changed properly, which will not be described in details herein. The subsequent chip package processes and structure refer to the descriptions of FIGS. 13A-13D.

FIGS. 13A-13D depict schematic flow charts of a chip package process using vertical conduction by the ACF in an embodiment of the present invention. First, referring to FIG. 13A, a substrate 400 is provided, and an ACF 410 is coated on a contact 402 of the substrate 400, while the conductive particles 412 of the ACF 410 are distributed uniformly in the resin 414. Then, referring to FIGS. 13B-13C, the back of the chip 310 is sucked by a bonding head 10, such that an active surface of the chip 310 faces toward the substrate 400 and the gold bump 350 on the chip 310 corresponds to the contact 402 of the substrate 400, and thus the step of heat pressing may be carried out. The bonding head 10 lowers down and applies a pressure on the chip 310, such that the gold bump 350 and the contact 402 are pressed together, and the conductive particles 412 are deformed after being pressed to create an effect of vertical conductivity. And since the gold bump has a recess 352 at its top, more conductive particles 412 can be captured therein, and the contact resistance between the gold bump 350 and the contact 402 can be reduced. Moreover, the bridging conduction problem of the conductive particles 412 can be avoided by disposing a plurality of stoppers 332 around the gold bump 350 of the chip 310, such that the reliability of the chip package structure can be obviously enhanced.

Figure 13A:
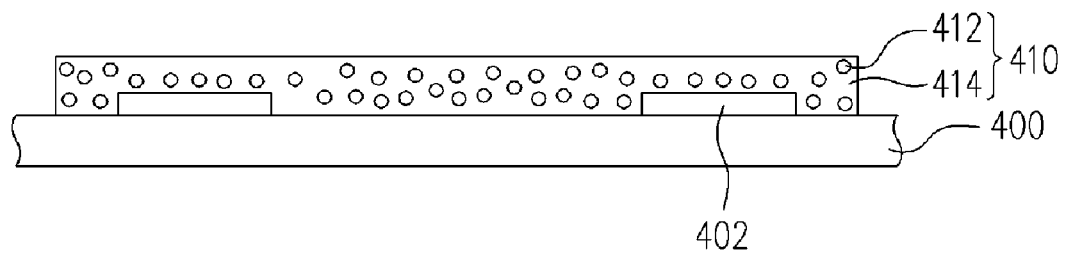
FIGS. 13A-13D depict a schematic flow chart of a chip package process using vertical conduction by the ACF, according to an embodiment of the present invention respectively.
Figure 13B:
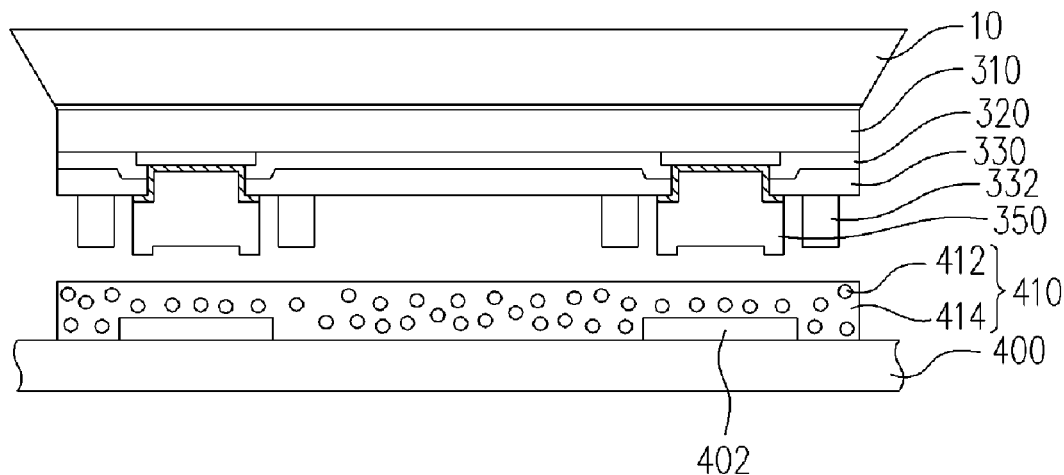
Figure 13C:
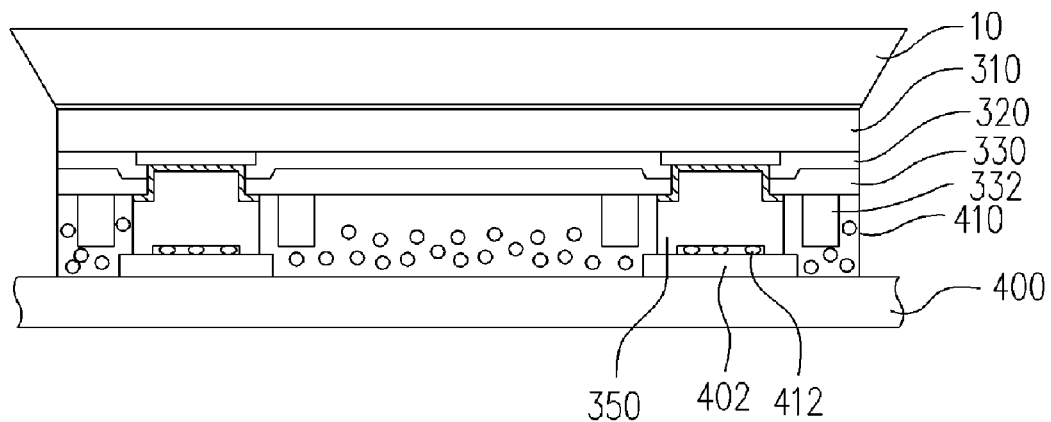
Figure 13D:
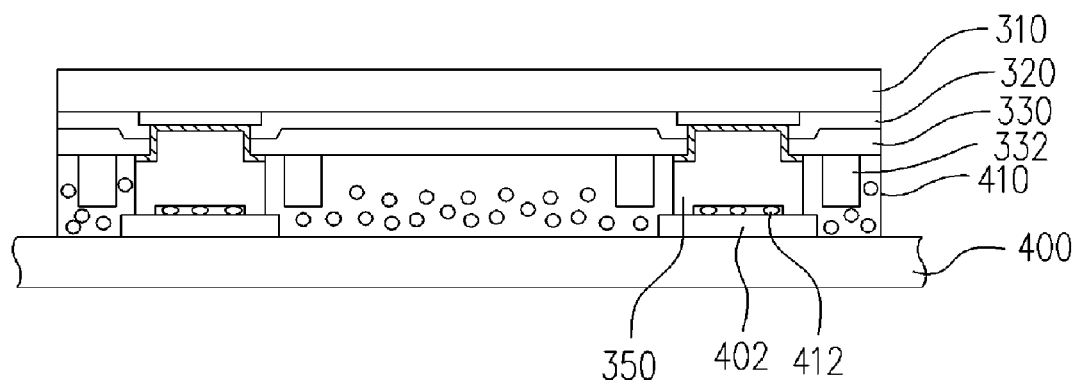

Referring to FIG. 13D, after the whole chip package process is completed and the ACF 410 is cured, the bonding quality of the gold bump 350 heat-pressed onto the contact 402 can be increased since the elastic layer 330 is disposed in the bottom of the gold bump 350. When the environmental temperature changes, the resin 414 itself will expand or contract, causing a slight change in the pitch between the gold bump 350 and the contact 402. However, the elastic layer 330 can also produce a reaction force as the environmental temperature changes, so as to balance the expansion force or contraction force of the resin 414. Therefore, the reliability of the chip package structure can be obviously enhanced.

Figure 14:
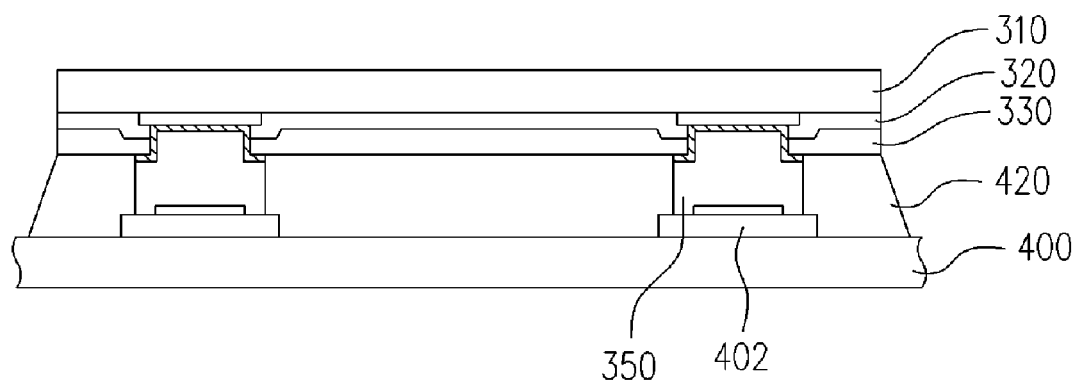
FIG. 14 depicts a schematic view of a chip package structure using shrinking bonding produced by the NCP/NCF, according to another embodiment of the present invention.

Furthermore, referring to FIG. 14, a schematic view of a chip package structure using shrinking bonding produced by the NCP/NCF in other embodiment of the present invention is depicted. In the process of FIGS. 13A-13D described above, the chip package structure of FIG. 14 can be obtained if ACF 410 is replaced with NCP/NCF 420. The gold bump 350 is heat-pressed onto the contact 402. The ultrasonic vibration can be applied to bond the gold bump 350 because of the deformation of its top, and meanwhile the elastic layer 330 can also produce a reaction force as the environmental temperature changes to balance the expansion force of the NCP/NCF 420. Therefore, the reliability of the chip package structure can be obviously enhanced.

Referring to FIGS. 15A-15H, a schematic flow chart of a bumping process having elastic granular structures in an embodiment of the present invention is depicted respectively. First, referring to FIG. 15A, a wafer 500 having a plurality of chips 510 and a passivation layer 520 is provided, and each chip 510 has at least one bonding pad 512 exposed in an opening 522 of the passivation layer 520. Then, referring to FIG. 15B, a plurality of elastic granular structures 530 are formed around the opening 522 of the passivation layer 520. And then, referring to FIG. 15C, a metal layer 540 is sputtered or evaporated. The metal layer 540 can cover the top surface of the bonding pad 512 and further outwardly cover the top surfaces of the elastic granular structure 530 and the passivation layer 520, besides being covered on.

Figure 15A:
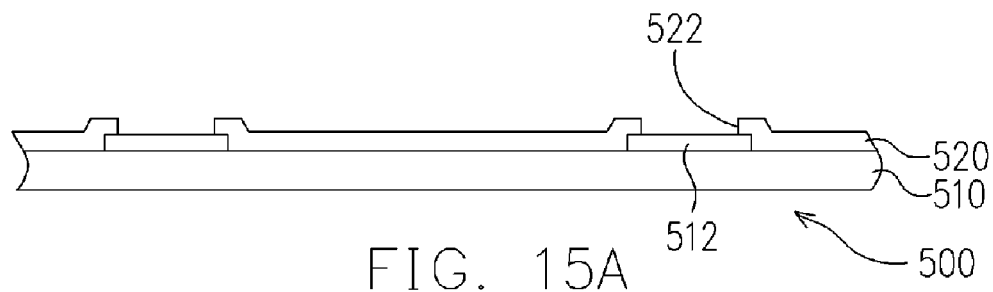
FIGS. 15A-15H depict a schematic flow chart of a bumping process having elastic granular structures, according to an embodiment of the present invention respectively.
Figure 15B:
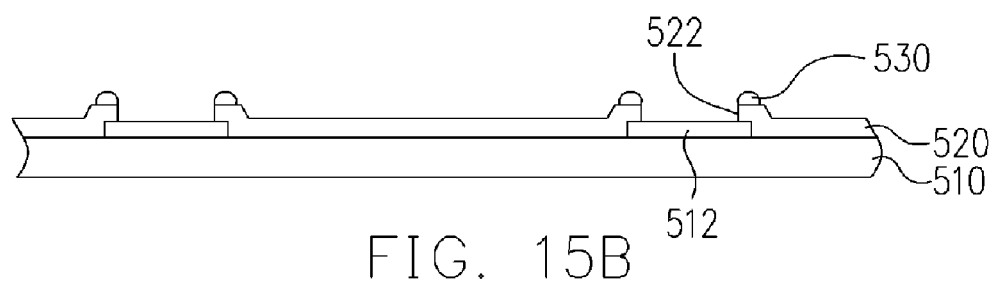
Figure 15C:
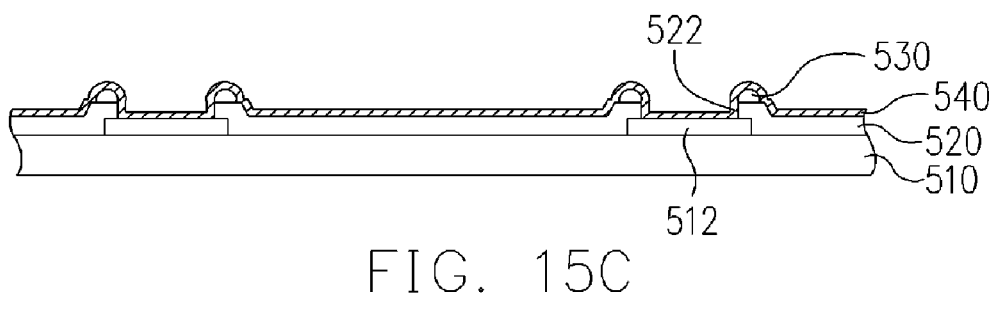
Figure 15D:
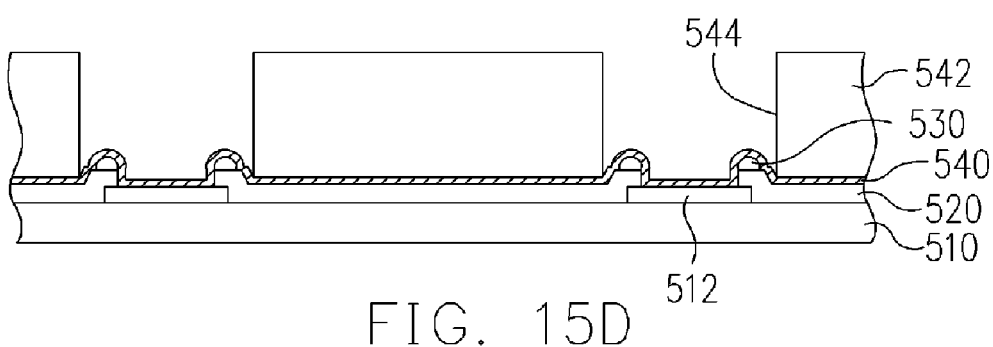
Figure 15E:
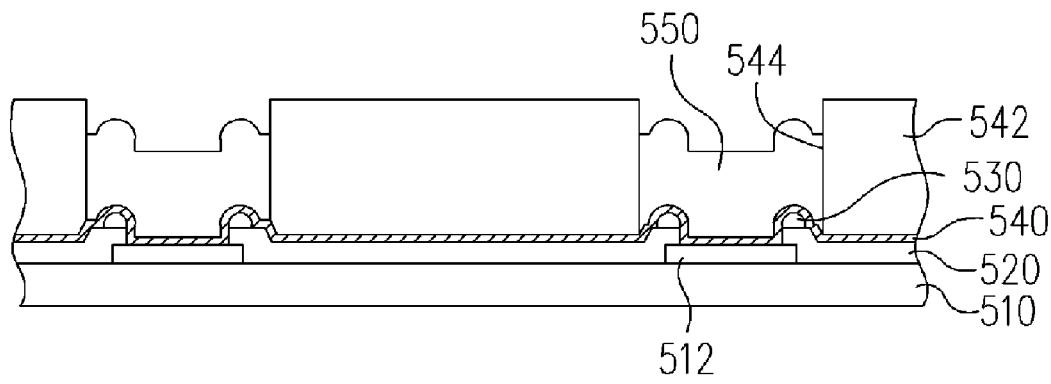
Figure 15F:
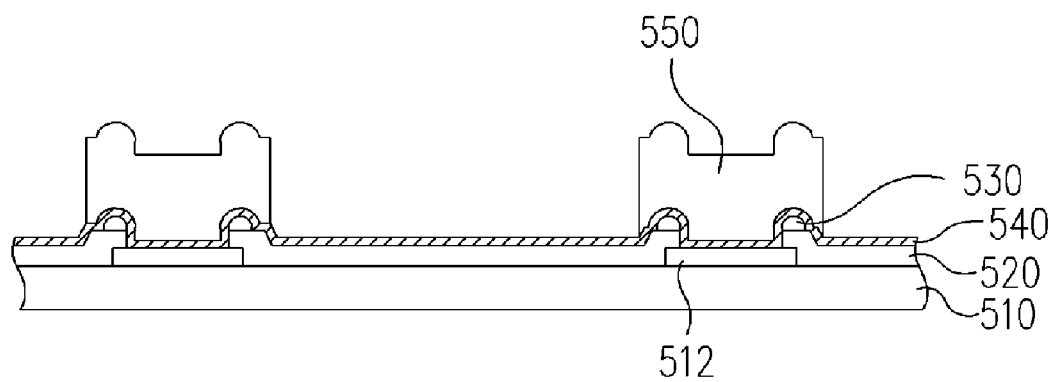
Figure 15G:
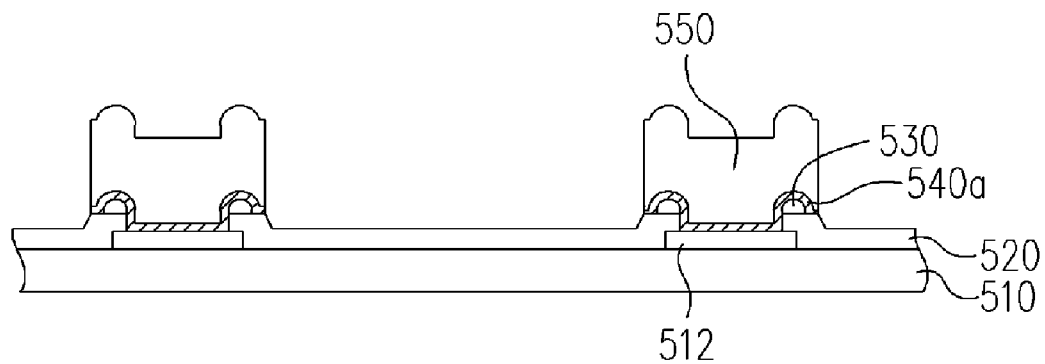

Referring to the process of plating the gold bump in FIGS. 15D-15F, a photoresist 542 is spin-coated on the metal layer 540 and then exposed and developed to form a proper opening 544 for exposing the metal layer 540 above the bonding pad 512. Next, a plating process is performed by taking the metal layer 540 as a seed layer for plating, such that a gold bump 550 is grown in the opening 544. Then, the photoresist 542 is removed with a solvent, and the gold bump 550 is thereby obtained. Moreover, in FIG. 15G, a part of the metal layer 540 on the surface of the passivation layer 520 is removed with an etching agent, and only the metal layer 540a at the bottom of the bump 550 is reserved. Although the plating process is used to form the bump 550 in the present embodiment, other techniques for fabricating bumps can also be used without limitation.

Figure 15H:
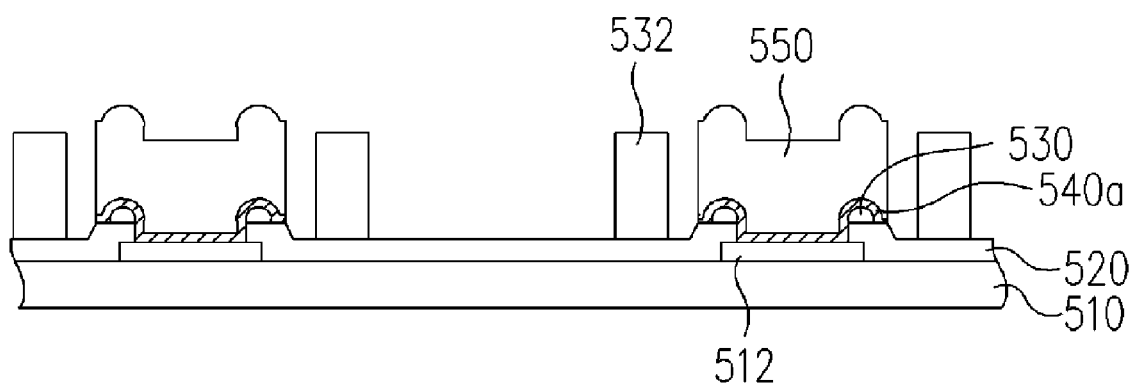

Referring to FIG. 15H, at least one stopper 532 can be further disposed around the bump 550, and the shape and arrangement of the stopper 532 can be changed properly, which will not be described in details herein. Please refer to the descriptions of FIGS. 16A-16D for the subsequent chip package processes and structure.

FIGS. 16A-16D depict a schematic flow chart of a chip package process using vertical conduction by the ACF in an embodiment of the present invention. First, referring to FIG. 16A, a substrate 600 is provided, and an ACF 610 is coated on contact 602 of the substrate 600, while the conductive particles 612 of the ACF 610 are distributed uniformly in the resin 614. Next, referring to FIGS. 16B-16C, the back of the chip 510 is sucked by a bonding head 10, such that the gold bump 550 of the chip 510 faces toward the substrate 600, and the gold bump 550 on the chip 510 corresponds to the contact 602 of the substrate 600. Thus, the step of heat pressing may be performed. The bonding head 10 lowers down and applies a pressure on the chip 510, such that the gold bump 550 and the contact 602 are pressed together. An effect of vertical conductivity is created by the deformation of the conductive particles 612 after being pressed. Also, since the gold bump 550 has a recess 552 and a protruding surface 554 at its top, more conductive particles 612 can be captured therein, and the deformation of the top surface of the gold bump 550 is increased because of the disposition of the elastic granular structure 530, the contact resistance between the gold bump 550 and the contact 602 can thus be reduced. Moreover, the bridging conduction problem of the conductive particles 612 can be avoided by disposing a plurality of stoppers 532 around the gold bump 550 of the chip 510, such that the reliability of the chip package structure can be obviously enhanced.

Figure 16A:
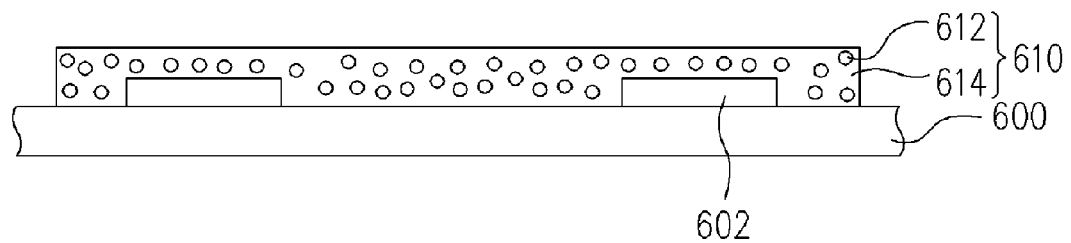
FIGS. 16A-16D depict a schematic flow chart of a chip package process using vertical conduction by the ACF, according to an embodiment of the present invention respectively.
Figure 16B:
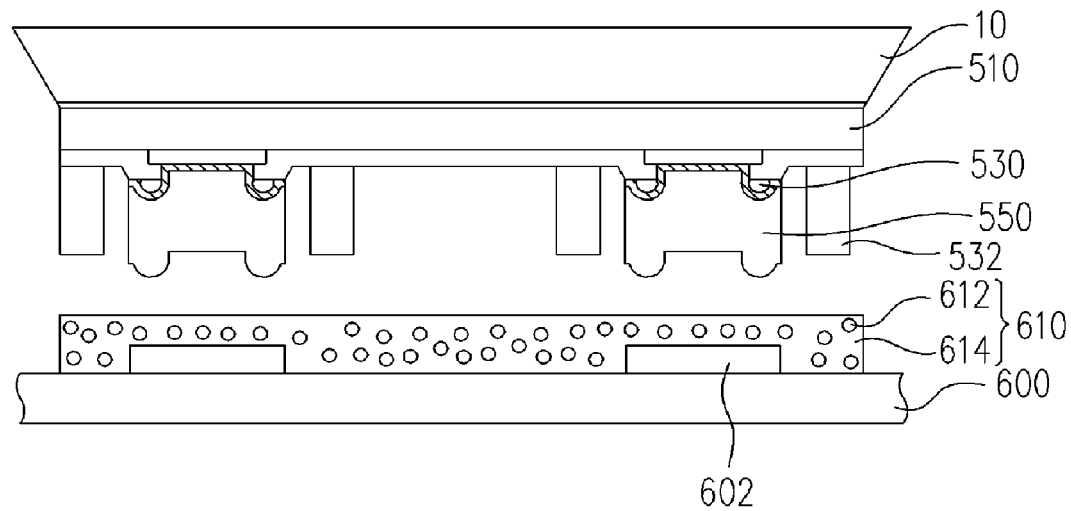
Figure 16C:
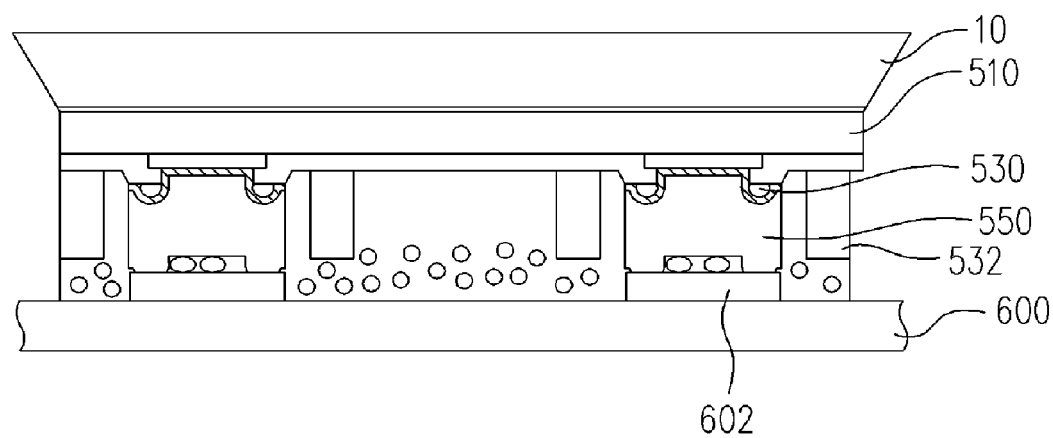
Figure 16D:
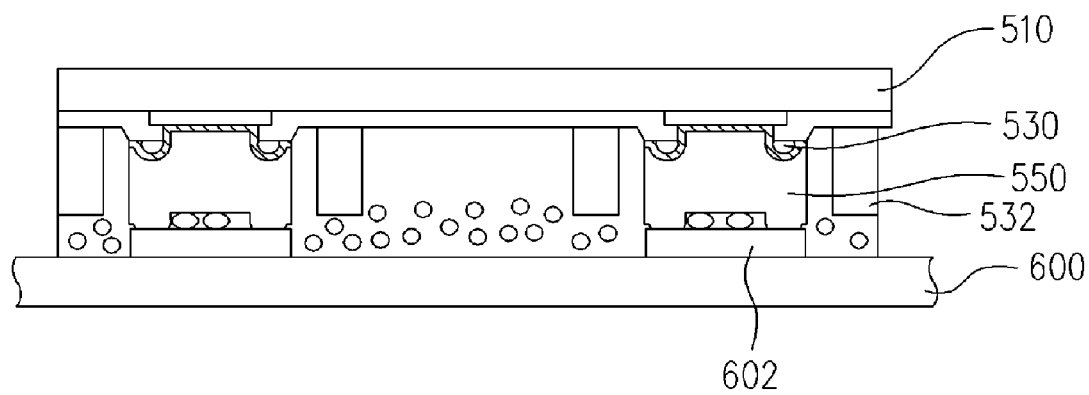

Referring to FIG. 16D, after the whole chip package process is completed and the ACF 610 is cured, the bonding quality of the gold bump 550 heat-pressed onto the contact 602 can be improved since the elastic layer 530 is disposed at the bottom of the gold bump 550. When the environmental temperature changes, the resin 614 itself will expand or contract, causing a slight change in the pitch between the gold bump 550 and the contact 602. However, the elastic layer 530 can also produce a reaction force as the environmental temperature changes to balance the expansion force or contraction force of the resin 614. Therefore, the reliability of the chip package structure can be obviously enhanced.

Figure 17:
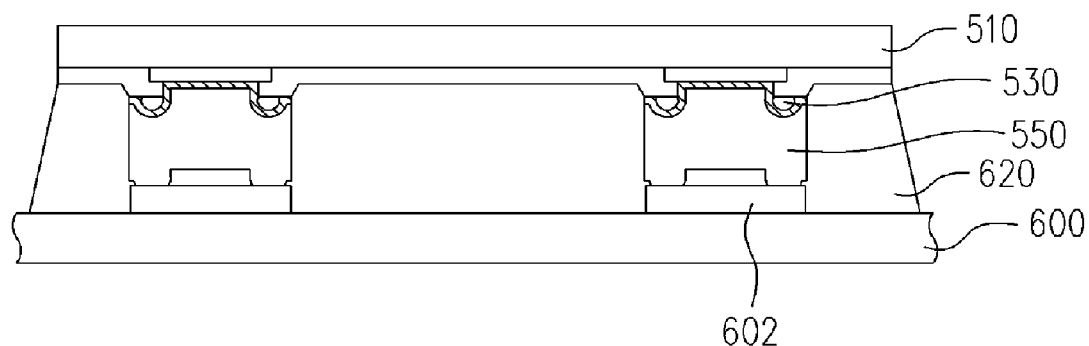
FIG. 17 depicts a schematic view of a chip package structure using shrinking bonding produced by the NCP/NCF, according to another embodiment of the present invention.

Furthermore, referring to FIG. 17, a schematic view of a chip package structure using shrinking bonding produced by the NCP/NCF in another embodiment of the present invention is depicted. In the process of FIGS. 16A-16D described above, the chip package structure of FIG. 17 can be obtained if ACF 610 is replaced with NCP/NCF 620. The gold bump 550 is heat-pressed onto the contact, and the ultrasonic vibration can be applied to bond the gold bump 550 because of the deformation of its top, and meanwhile the elastic layer 530 also can produce a reaction force as the environmental temperature changes to balance the expansion force of the NCP/NCF 620. Therefore, the reliability of the chip package structure can be obviously enhanced.

In summary, the present invention can be applied in the techniques for packaging LCD driver chips, which employs a chip structure having an elastic layer and/or elastic granular structures and bumping process. Therefore, the electrical performance can be improved after the bump being heat-pressed to the contact by the stress-buffering effect of the elastic layer and/or elastic granular structures. An improved contact stress can be maintained, so as to enhance the bonding reliability of the bump. Additionally, the chip package structure can be further provided with the stoppers to prevent the conductive particles of high density from aggregating in the area between the bumps to induce a bridge short. Especially, when the pitch between the adjacent gold bumps trends toward microminiaturization, the phenomenon of conventional bridging conduction will be more apparent, and therefore, the effect of the stoppers will significantly enhance the reliability of the chip package structure.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A chip structure comprising:
   a chip having an active surface, the chip having at least a bonding pad disposed on the active surface;
   a passivation layer covering the active surface, the passivation layer having at least a first opening for exposing a surface of the bonding pad correspondingly;

an elastic layer covering the passivation layer, the elastic layer having at least a second opening for exposing the first opening correspondingly;
a metal layer covering at least the surface of the bonding pad and a part of the elastic layer; and
a plurality of elastic granular structures protruding at a periphery of the second opening of the elastic layer and further covered by the metal layer.

2. The chip structure according to claim 1, further comprising a gold bump with a bottom connected to the metal layer and a top protruding out from the second opening.

3. The chip structure according to claim 2, wherein the gold bump has a recess on the top, correspondingly above the second opening.

4. The chip structure according to claim 1, wherein a material for the metal layer is one selected from the group consisting of gold, titanium, tungsten, chromium, copper and alloy thereof.

5. The chip structure according to claim 1, further comprising a solder bump having a bottom connected to the metal layer and a top protruding from the second opening.

6. The chip structure according to claim 1, wherein a material for the elastic layer is macromolecule polymer.

7. The chip structure according to claim 1, further comprising at least one stopper disposed around the second opening of the elastic layer.

8. A chip package structure, comprising:
a substrate having at least one contact;
a chip disposed on the substrate, wherein the chip has at least one bonding pad and an elastic layer having an opening for exposing a surface of the bonding pad;
a metal layer at least covering the surface of the bonding pad and a part of the elastic layer;
at least one bump, disposed on the metal layer and connected with the contact;
a resin covering the bump; and
a plurality of elastic granular structures protruding at a periphery of the opening of the elastic layer and further covered by the metal layer.

9. The chip package structure according to claim 8, wherein the resin is an anisotropic conductive resin, having a plurality of conductive particles electrically connected between the bump and the contact.

10. The chip package structure according to claim 8, wherein the resin is a non-conductive polymer.

11. The chip package structure according to claim 8, wherein a material of the bump comprises gold.

12. The chip package structure according to claim 8, wherein a material for the elastic layer is macromolecule polymeric material.

13. The chip package structure according to claim 8, further comprising at least one stopper disposed at a periphery of the opening of the elastic layer.

14. A chip package structure, comprising:
a substrate having at least one contact;
a chip disposed on the substrate, wherein the chip has at least one bonding pad and an elastic layer having an opening for exposing a surface of the bonding pad;
a metal layer at least covering the surface of the bonding pad and a part of the elastic layer;
at least one bump, disposed on the metal layer and connected with the contact, wherein a material of the bump comprises gold and a height of the bump is ranging from 10 μm to 15 μm; and
a resin covering the bump.

15. The chip package structure according to claim 14, wherein the resin is an anisotropic conductive resin, having a plurality of conductive particles electrically connected between the bump and the contact.

16. The chip package structure according to claim 14, wherein the resin is a non-conductive polymer.

17. The chip package structure according to claim 14, wherein a material for the elastic layer is macromolecule polymeric material.

18. The chip package structure according to claim 14, further comprising at least one stopper disposed at a periphery of the opening of the elastic layer.

* * * * *